United States Patent
Jin et al.

(10) Patent No.: US 8,957,711 B2
(45) Date of Patent: Feb. 17, 2015

(54) PHASE LOCKED LOOP WITH PRECISE PHASE AND FREQUENCY SLOPE LIMITER

(71) Applicant: Microsemi Semiconductor ULC, Kanata (CA)

(72) Inventors: Q. Gary Jin, Kanata (CA); Kamran Rahbar, Kanata (CA); Krste Mitric, Ottawa (CA); Tanmay Zargar, Austin, TX (US)

(73) Assignee: Microsemi Semiconductor ULC (CA)

( * ) Notice: Subject to any disclaimer, the term of this patent is extended or adjusted under 35 U.S.C. 154(b) by 0 days.

(21) Appl. No.: 14/263,170

(22) Filed: Apr. 28, 2014

(65) Prior Publication Data

US 2014/0320186 A1  Oct. 30, 2014

Related U.S. Application Data

(60) Provisional application No. 61/817,127, filed on Apr. 29, 2013.

(51) Int. Cl.
*H03L 7/06* (2006.01)
*H03L 7/107* (2006.01)

(52) U.S. Cl.
CPC .................................. *H03L 7/1075* (2013.01)
USPC ........................................... 327/156; 327/147

(58) Field of Classification Search
None
See application file for complete search history.

(56) References Cited

U.S. PATENT DOCUMENTS

| | | | |
|---|---|---|---|
| 6,784,706 B2* | 8/2004 | Van Der Valk et al. | 327/147 |
| 6,947,514 B1* | 9/2005 | Kato et al. | 375/376 |
| 7,126,429 B2 | 10/2006 | Mitric et al. | |
| 7,242,740 B2 | 7/2007 | Spijker et al. | |
| 7,369,002 B2 | 5/2008 | Spijker et al. | |
| 8,248,168 B2* | 8/2012 | Ganesh et al. | 331/16 |
| 8,306,176 B2* | 11/2012 | Staszewski et al. | 375/376 |
| 8,432,203 B2* | 4/2013 | Pialis et al. | 327/156 |
| 8,570,079 B2* | 10/2013 | Ferriss et al. | 327/156 |
| 8,698,567 B2* | 4/2014 | Thelen et al. | 331/44 |
| 2010/0283549 A1 | 11/2010 | Wang | |
| 2013/0063192 A1* | 3/2013 | Ferriss et al. | 327/157 |

* cited by examiner

*Primary Examiner* — Cassandra Cox
(74) *Attorney, Agent, or Firm* — Laubscher, Spendlove & Laubscher, P.C.

(57) ABSTRACT

Phase slope is controlled in a phase locked loop wherein a phase error signal controlling a controlled oscillator has a proportional component and an integral component, by determining whether the proportional component falls within a range bounded by upper and lower limit values. The proportional component is combined with the integral component if the proportional component falls within the range to provide the phase error signal. Otherwise, the proportional component is modified to meet a phase slope requirement while leaving the integral component unmodified. The modified proportional component is combined with the unmodified integral component to provide the phase error signal.

22 Claims, 7 Drawing Sheets

PHASE LOCKED LOOP WITH PRECISE PHASE AND FREQUENCY SLOPE LIMITER

CROSS REFERENCE TO RELATED APPLICATION

This application claims the benefit of U.S. provisional application No. 61/817,127 filed Apr. 29, 2013.

FIELD OF THE INVENTION

This invention relates to the field of clock synchronization, and in particular to a phase locked loop (PLL) with a precise phase slope limiter (PSL) and frequency slope limiter (FSL).

BACKGROUND OF THE INVENTION

The use of PLLs in communications over the years has become an ever-growing trend. New applications with specific synchronization requirements are demanding complex and flexible PLLs. Economic and integration reasons are pushing for support of multiple application scenarios, each requiring different standard prescribing synchronization clock criteria. User configurable flexibility has become an important requirement for new PLLs.

Synchronization clocks generated by PLLs are required to meet certain criteria for amount of phase and frequency change over prescribed time interval. While older telecom standards required relatively relaxed criteria for phase and frequency slope limits, new requirements, mainly driven by Timing over Packet switched network (ToP), are a couple of orders of magnitude tighter. The maximum allowed value for phase slope and frequency slope of any given clock is mainly determined by the ability of down-stream equipment to adjust its rate such that bit-errors are avoided following reference re-arrangement or either phase or frequency transients on the PLL's reference inputs.

To be able to effectively limit phase change behavior of a type 2 Phase Locked Loop (PLL) (namely a PLL that eliminates phase difference between its input and output upon either frequency or phase changes at its input), it has to be understood that the output clock phase consists of proportional (P) and integral (I) parts. The sum of the proportional and integral parts of the output clock phase change over a specified time has to be limited to a prescribed value. Also, it is important to understand that time required to withstand a prescribed phase slope limit by a PLL output is directly proportional to the maximum phase offset between the PLL's input and output that the PLL is required to withstand.

In the prior art, as is shown in FIG. 1, phase slope limiting is mainly taken care by limiting the proportional part of the PLL phase error whenever the phase difference between the PLL's input and output exceeds a certain threshold. This allows the PLL to maintain the same architecture and structure when used in phase slope limiting mode as when in normal non-limiting mode of operation. In order to meet the overall prescribed phase slope limit, two approaches are commonly adopted.

In the first approach, depending on the PLL bandwidth and damping factor, the proportional part is significantly over-limited such that after the specified time, which is proportional to the maximum phase error the PLL is required to withstand, the sum of proportional and integral part does not exceed prescribed phase slope limit. The disadvantage of this approach is a slowdown in PLL response time since at the beginning of the limiting process, when the accumulated integral part is small, the output phase changes are significantly smaller than the prescribed phase slope limit. Knowing that the change of integral part has an exponential characteristic, increasing the maximum phase error that the PLL is required to withstand for a particular application requires decreasing the proportional phase limit to the point where it no longer can be used.

The second approach involves freezing the integral part of the output clock phase and limiting the proportional part to a prescribed phase slope limit for a specified time so that the overall output clock phase slope limit can be maintained. The downside of this approach, which requires integral part to be frozen, lies in its inability to follow frequency changes since the integral part is responsible for frequency change compensation. In addition, after releasing the PLL from limiting to non-limiting phase slope mode, the PLL has to make frequency and phase adjustments in order to catch up with potential input frequency changes occurring while in the phase slope limiting mode.

The most common approach for limiting frequency change over a specified time (frequency slope) to a prescribed value, used in previous PLL implementations, is shown in FIGS. 2 and 3.

In this approach, the DCO frequency Fd change is simply limited to a prescribed FSL limit when the difference between the current and previous value exceeds the limit. The downside of this approach lies in the fact that the PLL may become unstable due to slow response to fast frequency changes with constant limiting.

SUMMARY OF THE INVENTION

Embodiments of the invention address issues arising from the previous PLL implementations by introducing an innovative method of performing phase slope limiting that allows constant phase slope limiting over specified time, proportional to the maximum required phase error, while at the same time maintaining updates of the integral part of the output clock phase.

According to a first aspect of the invention there is provided a method of controlling phase slope in a phase locked loop wherein a phase error signal controlling a controlled oscillator has a proportional component and an integral component, comprising determining whether the proportional component falls within a range bounded by upper and lower limit values; combining the proportional component with the integral component if the proportional component falls within said range to provide said phase error signal; otherwise modifying the proportional component to meet a phase slope requirement while leaving the integral component unmodified, and combining said modified proportional component with said unmodified integral component to provide said phase error signal.

The proportional component may be saturated to a value within the range and the output signal modulated with a decay function to obtain the modified proportional component for combination with the integral component.

In one embodiment, whenever the proportional part of the PLL phase error exceeds the phase slope limits set by the user then it is first bounded by a non-linear function that saturates the input phase error to fixed positive and negative values programmed by the user. The output of this non-linear function is then modulated with a specific exponential decaying function with rate of decay dependent on the PLL bandwidth and damping factor.

An advantage of modifying the proportional component and leaving the integral component unchanged is that this procedure allows the PSL to be kept constant while the PL tracks frequency since the integral component is responsible for frequency tracking.

The PSL module will only limit the phase variation of the output clock but it cannot control the slope of the frequency variation. For this purpose a second module controls the PLL frequency change rate when a frequency change is detected. When it is finished, normal PLL operation resumes.

Accordingly a second aspect of the invention provides a method of controlling frequency slope in a phase locked loop susceptible to a reference frequency change including a controlled oscillator normally controlled by a first control signal from a loop filter, comprising: determining from a current frequency of the controlled oscillator, a new reference frequency and a frequency slope limit requirement, a time period T to change the oscillator frequency to the new current frequency while meeting said frequency slope requirement; and if a predetermined condition is met comprising the difference in frequency between said new reference frequency and the current oscillator frequency being greater than a predetermined value, replacing said first control signal by a second control signal to increase the current frequency of the oscillator to the new current frequency over said time period T.

Embodiments of the invention may provide a phase locked loop (PLL), used for clock synchronization, which has a loop filter with programmable phase and frequency slope limiter, allowing output phase and frequency variation to be accurately bounded based on the programmed phase and frequency slope limits.

An important advantage of present invention compared with the prior art is that in response to a phase step at the input clock reference, the output clock phase variation can be bounded such that at no time will the output phase slope limit exceed a user entered programmed value. At the same time while maintaining the output phase slope limit constraint, the PLL can quickly pull in the remaining phase offset between the input and the output.

While limiting the output clock phase slope, embodiments of the present invention allow tracking frequency changes of the input reference, an important feature lacking in the prior art. In the case of the frequency slope limiter, two separate cases are described with slightly different architectures: the reference switch and the reference frequency transient. The FSL architecture presented is robust and works well even under wander and jitter noise environment.

Another aspect of the invention provides a phase locked loop with controlled phase slope wherein a phase error signal controlling a controlled oscillator has a proportional component and an integral component, comprising a phase slope controller configured to: determine whether the proportional component falls within a range bounded by upper and lower limit values; combine the proportional component with the integral component if the proportional component falls within said range to provide said phase error signal; and otherwise modify the proportional component to meet a phase slope requirement while leaving the integral component unmodified, and combine said modified proportional component with said unmodified integral component to provide said phase error signal.

BRIEF DESCRIPTION OF THE DRAWINGS

The invention will now be described in more detail, by way of example only, with reference to the following drawings, in which.

DETAILED DESCRIPTION OF EMBODIMENTS OF THE INVENTION

Figure 4:
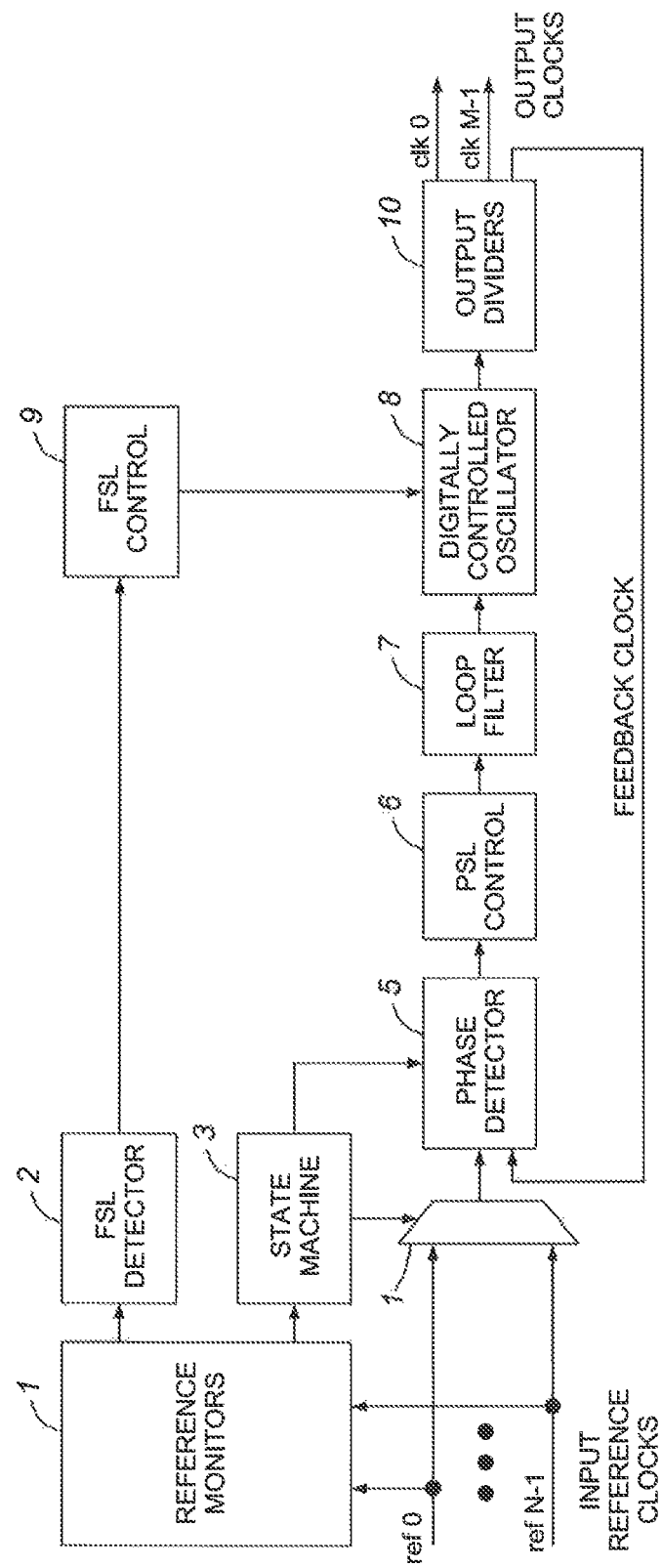
FIG. 4 is a high level block diagram of the PLL circuit according to an embodiment of the invention.

FIG. 4 shows an embodiment of a PLL capable of precise phase and frequency slope control of its output clocks. The PLL is a type 2 PLL wherein the output of the loop filter is a combination of proportional and integral components. The PLL consists of a reference monitor module 1, which monitors the existence and frequency offset of the input reference clocks and notifies state machine module 3 about the reference clocks' reliability. Hysteresis functionality is implemented in the reference monitor modules 1, such that bouncing among references is prevented when frequency offset of the preferred input reference clock is close to the reliability boundary.

One of the core blocks for FSL control is the FSL control block 9, which detects a frequency change due to either transients at the input reference or due to a reference switch.

The state machine 3 controls the input reference multiplexer 4, selects appropriate frequency information corresponding to the selected reference and switches the PLL automatically to and from holdover mode. Any of N input references can be selected as the preferred reference. If the preferred reference fails specified timing criteria, the state machine 3 will lock the PLL to the next non-failing reference, or switch the PLL into the holdover mode if all input references fail.

The input reference multiplexer 4 selects one of N input reference clocks as the input clock for the PLL.

The Phase Detector 5 measures the difference in phase between the input reference clock and the output feedback clock on every reference clock edge. The measured phase error at the output of the phase detector 5 is passed to the phase slope limiter (PSL) module 6.

The PSL module 6 guarantees that output clock phase slope will not exceed a certain value programmed by the user.

The loop filter 7 filters the phase error generated in the phase detector 5 and converts the phase error to a frequency offset for the digitally controlled oscillator (DCO) 8.

The loop filter determines the bandwidth of the PLL. Also the locking behavior of the PLL mainly depends on the loop filter parameters.

The DCO 8 generates a clock that is phase-locked to the input reference clock. The system clock and the center frequency number inside the DCO module 8 determine the frequency of the generated clock. The frequency offset value from the loop filter 7 is added to the center frequency number such that phase of the feedback clock, coming from the generated clock, is shifted toward reducing the phase error.

The FSL control block 9 combined with the FSL detection block 2 guarantees that the output clock frequency slope will not exceed a certain value programmed by the user.

The divider module 10 is used to generate all required output clocks and the PLL feedback clock by dividing generated clocks from the DCO module 8.

Figure 5:
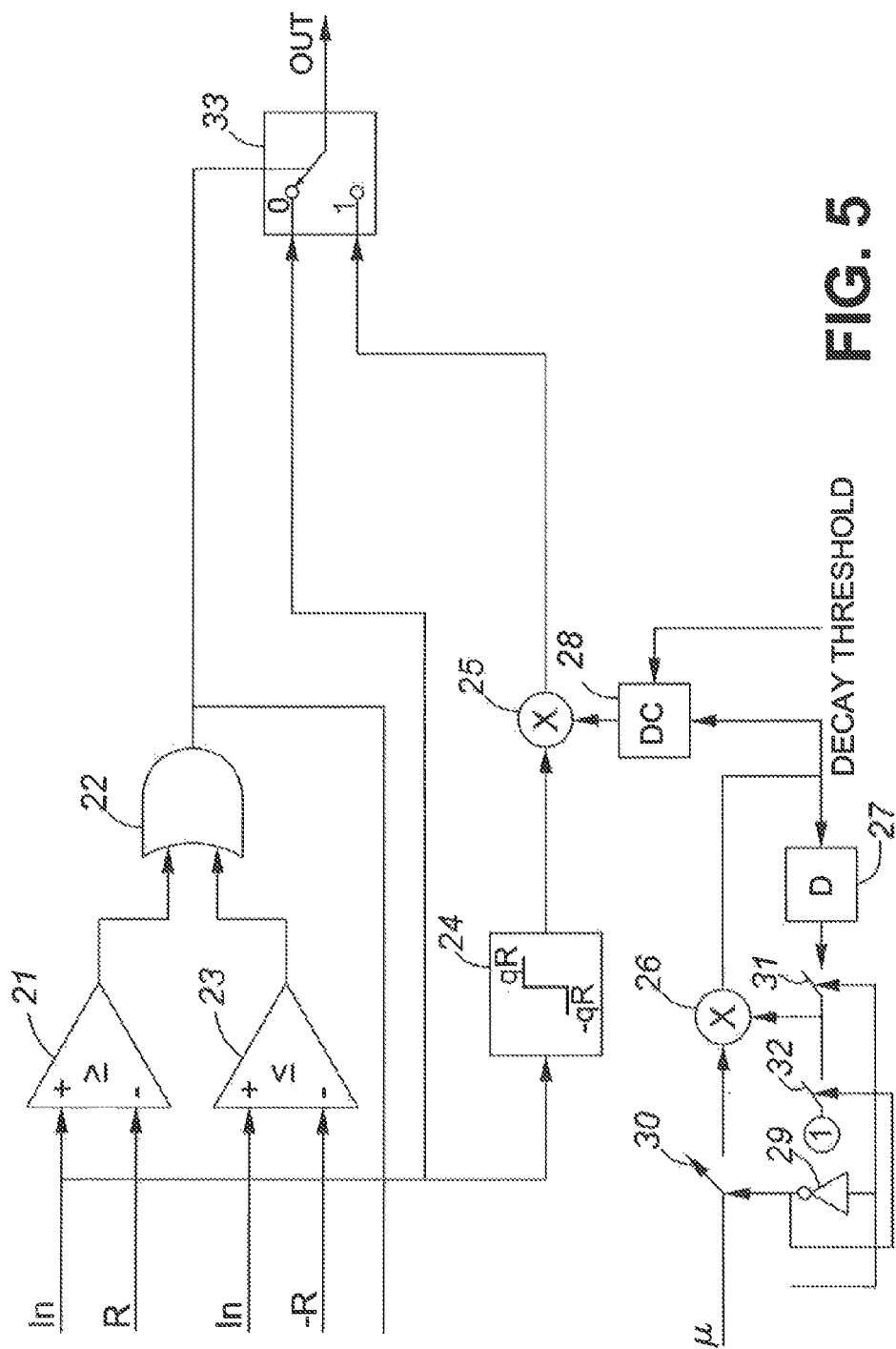
FIG. 5 is a block diagram of a PSL module according to an embodiment of the invention.

FIG. 5 is a block diagram of the PSL module 6. The main function of this module is to control the rate of the phase variation at the output of the PLL. The input to the PLL module comes from p-memory (not shown), which is directly proportional to the PLL phase error.

The output of the PSL module 6 is added to the output of the I-memory block (not shown), which is the integral of the phase error, and together they form the delta frequency update value for the DCO 8.

In FIG. 5, R represents the PSL value programmed by the user and q represent the margin between by user programmed value and the actual PSL value of the output. For example if q=0.9, then the actual PSL value of the output will be 90% of the limit value programmed by the user.

As can be seen from FIG. 5, the input to the PSL is In is compared to R and −R using the comparators 21 and 23. If the input to the PLL, which is directly proportional to the PLL phase error, is within the range of −R to R then the output of the both comparators will be zero and the input to the PSL will be passed directly to the output of the PSL via selector switch 33.

When the input to the PSL module is greater than the R or less than the −R, the output of one of the comparator will be high and as result the output of the PSL module will be a modified version of the input, with the modification performed using blocks 24 to 32.

The block 24 saturates the input to value qR when the input is greater than R and to −qR when the input is less than −R. By doing so the output phase variation of PLL due to the p-memory path will be bounded but for a limited range of input phase steps. To allow for bigger phase steps at the input of the PLL, q must be programmed to a smaller value. This will have the negative effect of unnecessarily slowing down the response of the PLL to an input phase step. To overcome this problem, blocks 25 to 32 are employed.

Parameter μ has a value that depends on the PLL damping factor and bandwidth, and is calculated from following equation:

$$\mu = e^{2\pi BWT_s/4\xi^2}$$

where BW is the bandwidth of the PLL, ξ is the damping factor and Ts is the sampling time period of the PLL.

If output of the block 22 is low, then the switches 30 and 32 are closed and switch 31 is open. In this case the output of the block 26 will be same as the parameter μ.

If the output of block 22 is high, which is the case when input phase variation exceeds the programmed PSL value, switches 30 and 32 are open and switch 31 is closed. In this case the output of block 26 is multiplied by its previous values (output of the delay element 27) to create an exponential decay function given by $$\mu^n = e^{2\pi BWnT_s/4\xi^2}$$

where n is the index to the number of samples since switch 31 was is closed.

The block 28 is used to control the amount of decay at the output of the block 24. If the input to the block 28 is less than a decay threshold, then the output of the block 28 will be set to the decay threshold, otherwise the output of the block 28 will be same as its input.

Figure 6:
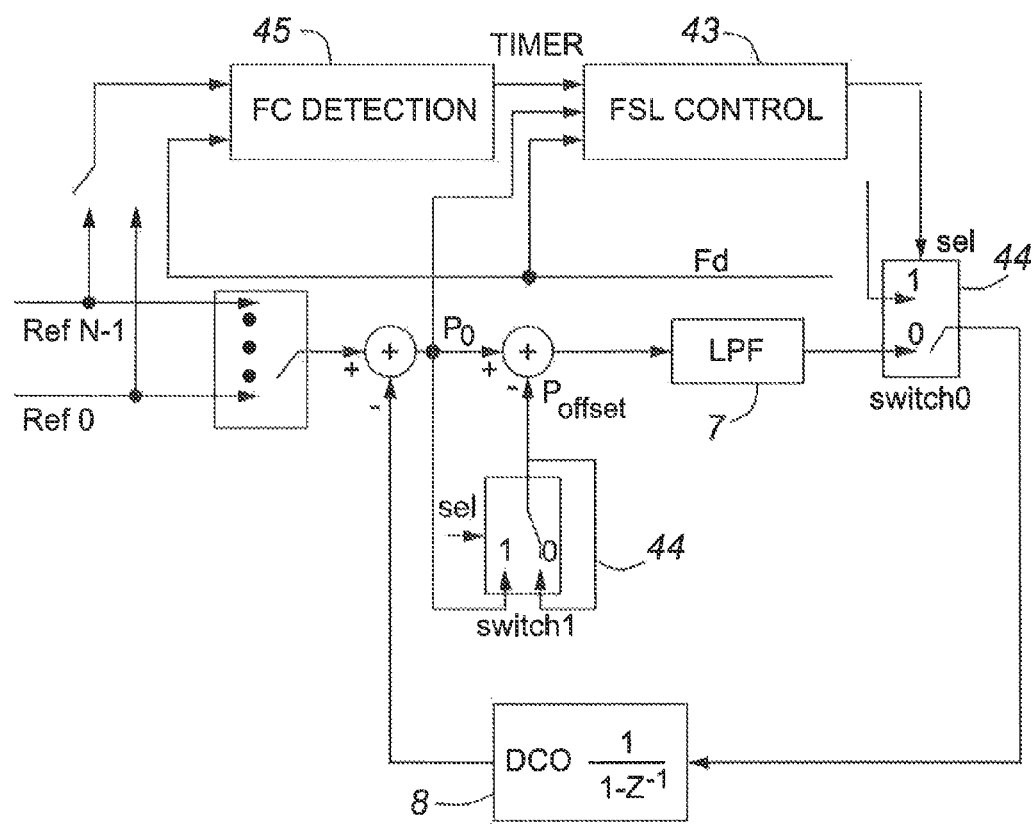
FIG. 6 is a block diagram of a PLL with an FSL for a reference switch.

FIG. 6 shows the FSL architecture used for the cases when a reference switch occurs (either manually or automatically). The main path is the same as in a traditional PLL. The input reference phase (phase of any of available references Ref0 to RefN−1 selected by multiplexer 41) is compared with the phase of local DCO 8. The phase error $P_e$ further subtracts the phase offset value $P_{offset}$ and the result is fed to the loop filter LPF 7, which can be any suitable low pass filter. The output of the filter 42 is the frequency offset Fd. The local DCO 8 takes Fd and integrates it to generate a local phase.

In the normal operation with switch 44 set at sel=0, the DCO input frequency is the normal PLL filter output Fd. When frequency slope exceeds the limit during a reference switch, the DCO 40 takes the output (sel=1) from the FSL control block 45 as its frequency input value.

Figure 1:
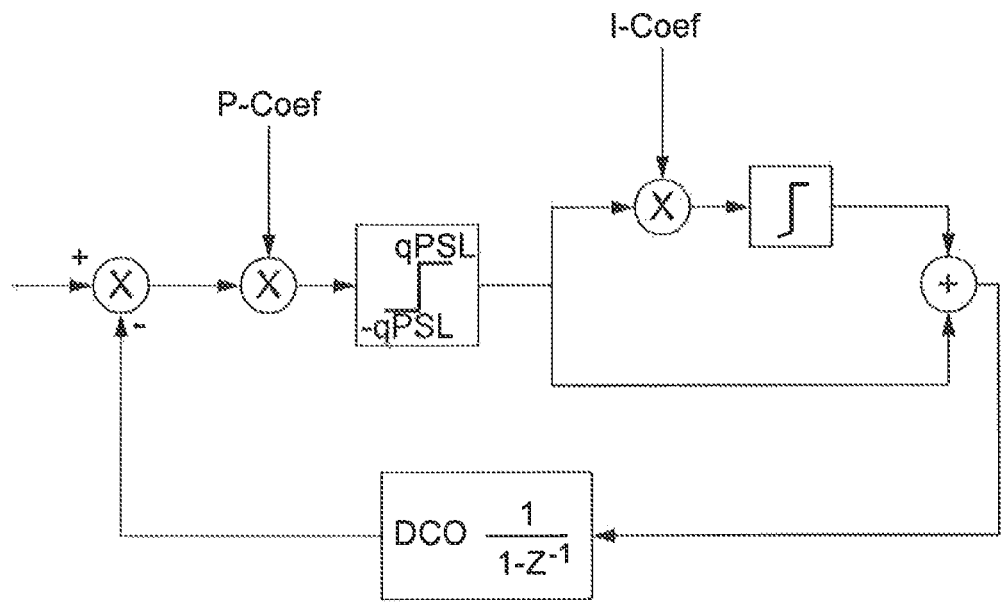
FIG. 1 is a prior art implementation of a PSL.
Figure 2:
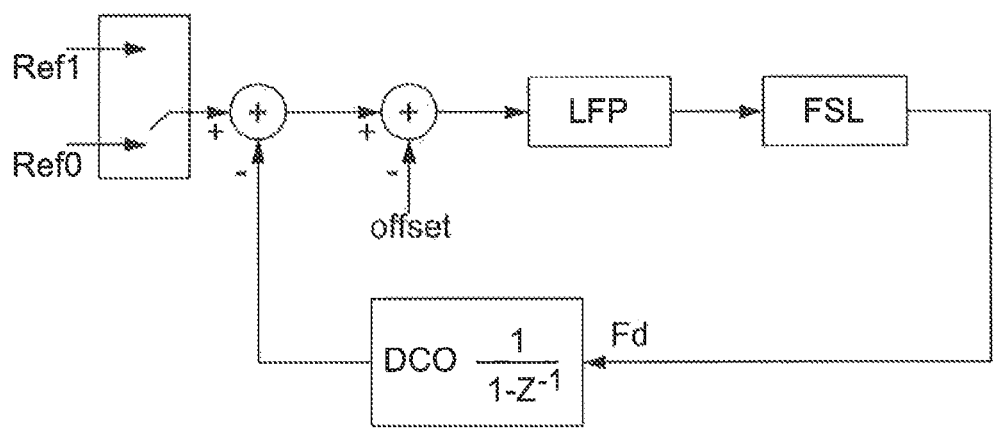
FIG. 2 is a prior art implementation of an FSL.
Figure 3:
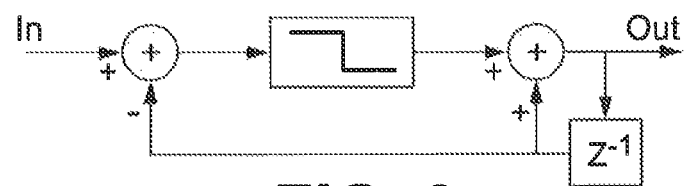
FIG. 3 is a block diagram of a prior art FSL.

During the normal operation when the switch 44 is set for either sel=0 or 1, the operation is the same as that in FIG. 2 and the phase offset value $P_{offset}$ is a constant value. The Poffset changes only to take the current phase error when sel for the switch 44 changes from 1 to 0, i.e., when the FSL control finishes and normal PLL operation resumes.

Figure 7:
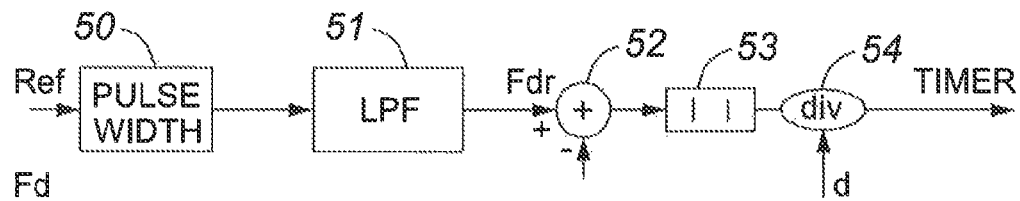
FIG. 7 is an FC Detection circuit for the PLL shown in FIG. 6.

The frequency change (FC) detection unit 45 is implemented as shown in FIG. 7. The FC detection unit 45 takes the new reference, shown in FIG. 6 this non-limiting example as RefN−1 (It will be appreciated that the new reference can be any of N−1 references, ref0 to Ref N−1) and the current DCO frequency Fd as inputs. The pulse width, which is the time between two reference pulse edges, (typically from rising edge to rising edge) is evaluated in block 50 and the result passed through a low pass filter 51 to obtain an average value, which is an estimate of the average reference frequency. This frequency is then compared with the current DCO frequency in comparator 52, and the output passed through modulo block 53 to divider 54.

Frequency slope control is implemented when the difference between the new reference frequency and the oscillator frequency is greater than a limit frequency is δ Hz per unit cycle. The output of FC Detection unit 45 is a time period Timer (in units of operation cycles), which is the absolute value of the ratio of the frequency difference between the average reference frequency and the current DCO frequency and δ. In one non-limiting example, if the period Timer is greater than zero, frequency slope control is needed; otherwise normal PLL operation occurs.

Figure 8:
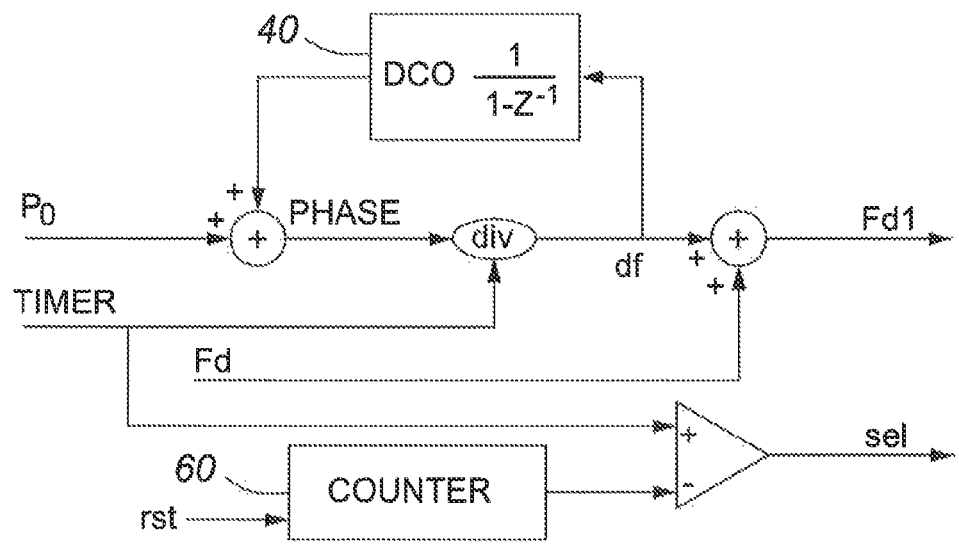
FIG. 8 is a block diagram of an FSL control module.

A non-limiting embodiment of the FSL control implementation is shown in FIG. 8. It takes the output Timer from the FC Detection unit 45 and compares it with a cycle counter 60, which is initially reset to zero. If Timer is larger than zero, sel is set to 1 and FSL control 43 takes over the control of local DCO 40 until the time expires (the counter reaches the value of Timer). During this period of time, the Fd slowly reaches the new frequency value Fd1, ensuring that df does not exceed required FSL.

The frequency difference between the two sources is Fd1−Fd. During the time T (KM: wrong, T is freely chosen interval of time smaller than Timer), the phase accumulation between new input reference and local DCO is (Fdr−Fd)*T (where Fdr is the new reference frequency) and df=(Fdr−Fd)*T/Timer where 0<T<Timer. Therefore df will linearly increase from 0 to Fdr−Fd. As the result, the output frequency Fd1 linearly changes from Fd to Fdr in the time period Timer.

The DCO 40 in FIG. 8 compensates for the phase adjustment occurring in the FSL mode in the normal PLL loop during FSL operation so that the value Phase will be the same as (Fdr−Fd)*T. This allows hitless transition from FSL limiting mode to regular PLL mode.

Figure 9:
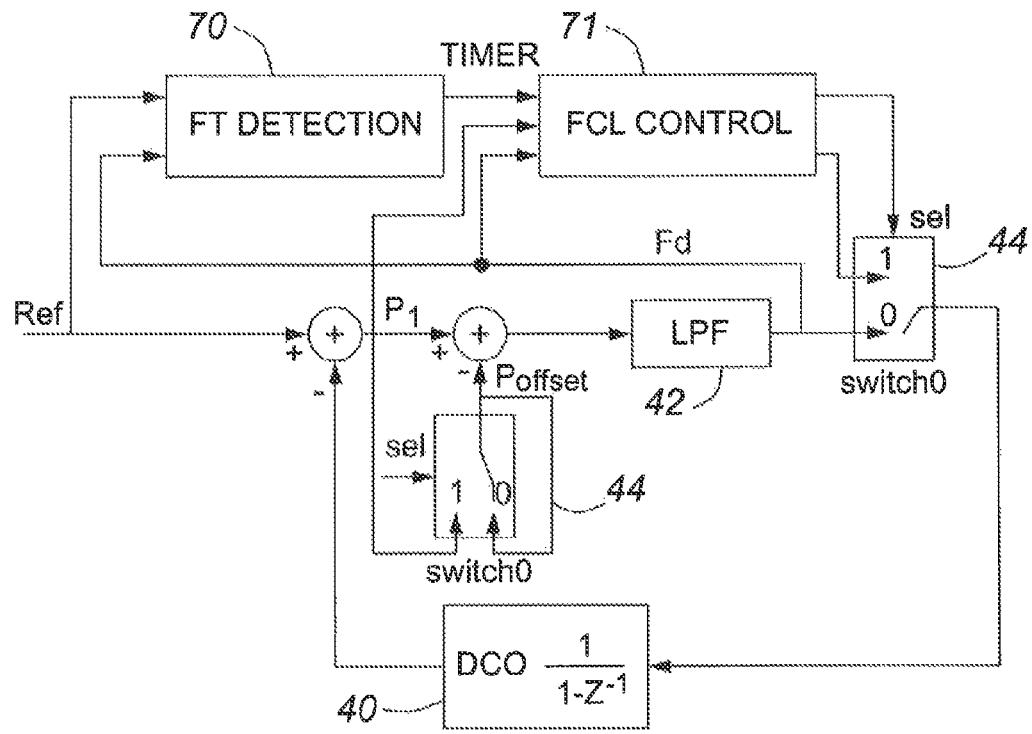
FIG. 9 is a block diagram of a PLL with an FSL a reference frequency transient.

The FSL architecture for cases when reference frequency transient occurs is shown in FIG. 9. FIG. 9 is very similar to FIG. 6 with slight differences as follows: the input has only one reference and hence the Frequency Transient (FT) detection unit 70 is different from FC Detection unit 45 in FIG. 6.

Figure 10:
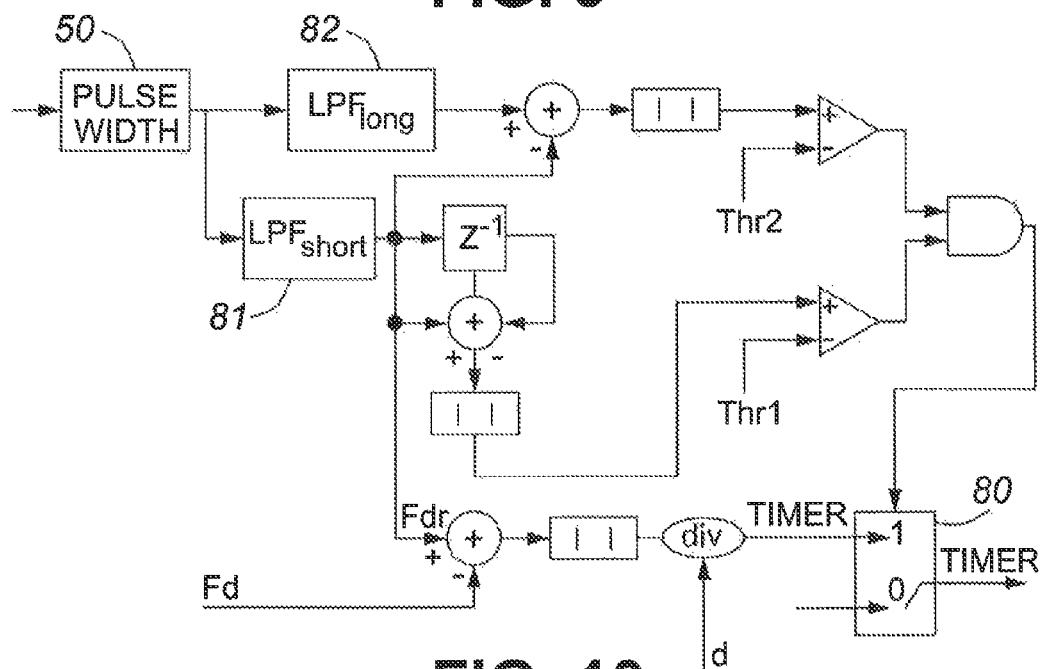
FIG. 10 is a block diagram of a reference frequency transient detector.

The FT Detection unit 70 for reference transient is shown in FIG. 10. Comparing FC Detection in FIG. 7 and FT Detection in FIG. 10, the differences are the manner of calculation of the reference frequency Fdr and a control switch 80 which decides whether the Timer value should be output or not. The Fdr is estimated with a filter $LPF_{short}$ 81, which, in general, has a much larger bandwidth or shorter time average than the filter $LPF_{long}$ 82, which may be the same filter used for the reference switch case shown in FIG. 7.

In case of reference frequency transient, for detection of exceeding frequency slope limit, in addition to Timer value being greater than zero, the following two conditions have to be satisfied:
1. The two sequential short term frequency estimates are almost the same, i.e., the difference between current Fdr and the previous one (with delay term $Z^{-1}$) are smaller than a threshold Thr1. This means that the same frequency offset is detected in recent two intervals.
2. The difference between current Fdr, which is output of the short average filter (high bandwidth) and output of the long term average filter (low bandwidth) is significantly different (larger than a threshold Thr2). This means that frequency transient happened in the last two intervals.

Because the frequency transient decision is made when the short term average filter shows the frequency change in both of their two most recent outputs, the decision is delayed by two to three time intervals of the short term average filter.

Figure 11:
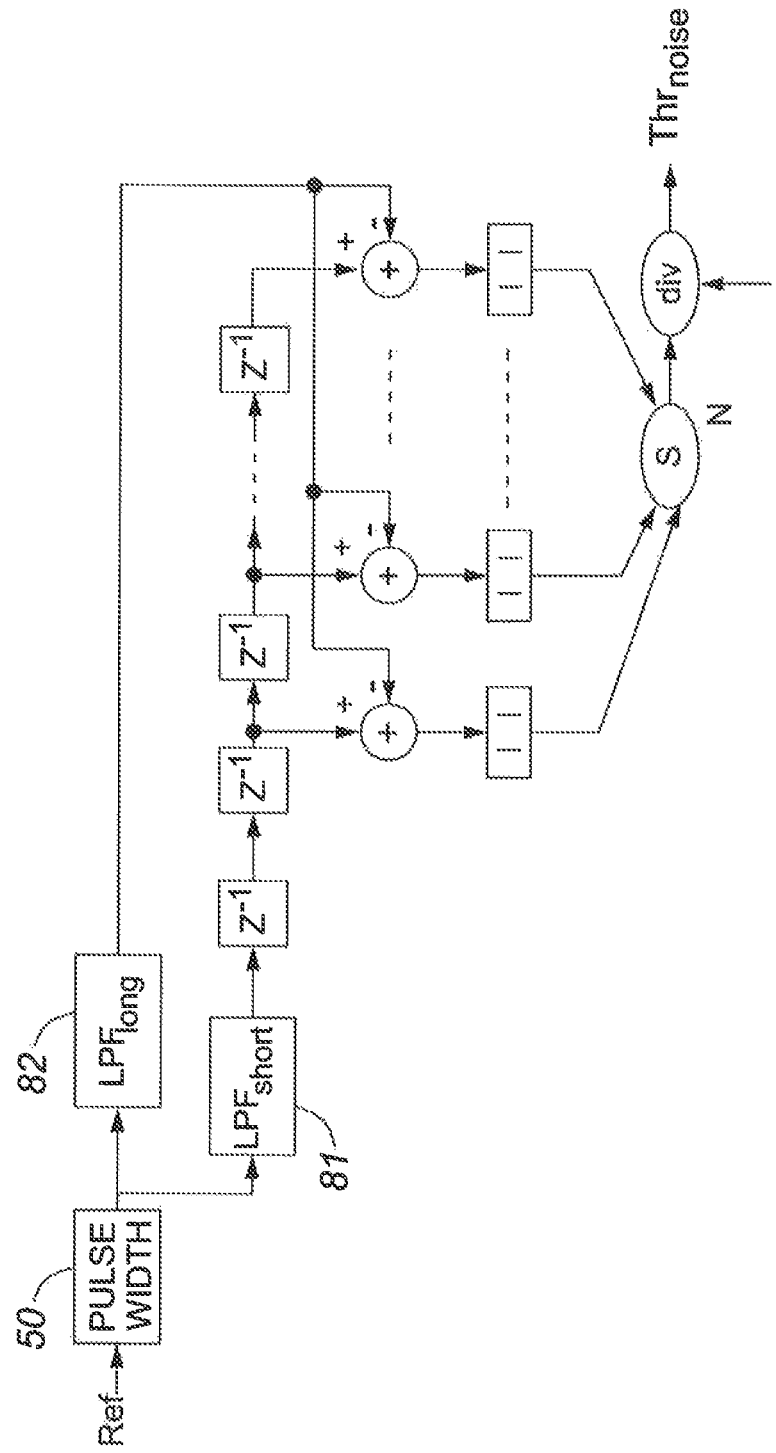
FIG. 11 is a block diagram of a noise variation estimation module.

In this non-limiting example, the threshold Thr1 is chosen as 3 times the noise variance $Thr_{noise}$. $Thr_{noise}$ can be estimated with the circuit shown in FIG. 11. All previous short-term average outputs are saved. These values should not experience a frequency jump except for the most recent two values. The difference between the old saved values excluding the most recent two and the long-term average output is calculated and their magnitudes are averaged (summed and then divided by the number of used saved outputs N). This average value can be used as the noise variance estimate $Thr_{noise}$.

If Thr1 is too large, it may give a false trigger for the frequency jump and if it is too small, noise may prevent detection of the jump. The formula for calculating Thr1 is $$Thr1 = 3Thr_{noise} + \epsilon$$

where $\epsilon$ is a small constant to take care of cases when $Thr_{noise}$ is zero.

The threshold Thr2 is calculated as follows:

$$Thr2 = \frac{\Delta(T_{long} - 2.5T_{short})}{T_{long}} + 2Thr_{noise}$$

where $\Delta$ is the minimum frequency jump which has to be detected. $T_{long}$ is the time constant of the filter $LPF_{long}$ and $T_{short}$ is the time constant of the filter $LPF_{short}$. Factor 2.5 takes consideration of 2 to 3 short time duration that has passed before the frequency jump is detected.

$LPF_{short}$ 82 may be a filter with 1 Hz bandwidth or equivalent, 1 second average time and the delay $Z^{-1}$ is in 1 second unit.

$LPF_{long}$ 81 may be a filter with a 10 mHz bandwidth or equivalent to 100 seconds average time.

Embodiments of the invention guarantee precise phase slope limit at the output clock of a synchronization device, while allowing the device to follow reference frequency changes. The exponential decaying methods guarantees constant phase slope limiting.

The references switch architecture described can be used for both manual and automatic switches.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Moreover, it will be understood that the blocks, units, modules and circuits described herein can be implemented as software modules.

The invention claimed is:

1. A method of controlling phase slope in a phase locked loop wherein a phase error signal controlling a controlled oscillator has a proportional component and an integral component, comprising:
   determining whether the proportional component falls within a range bounded by upper and lower limit values;
   combining the proportional component with the integral component if the proportional component falls within said range to provide said phase error signal;
   otherwise modifying the proportional component to meet a phase slope requirement while leaving the integral component unmodified, and combining said modified proportional component with said unmodified integral component to provide said phase error signal.

2. A method as claimed in claim 1, wherein the proportional component is saturated to a value within the range and the output signal is modulated with a decay function to obtain the modified proportional component for combination with the integral component.

3. A method as claimed in claim 2, wherein the proportional component is saturated to the closest limit value multiplied by a programmable scaling factor.

4. A method as claimed in claim 2, wherein the upper and lower limit values are programmable.

5. A method as claimed in claim 2, wherein the decay function is an exponential function of the form:

$$\mu^n = e^{2\pi BWnT_s/4\xi^2}$$

where BW is the bandwidth of the phase locked loop, $\xi$ is a damping factor, Ts is the sampling time period of the phase locked loop, and n is an index.

6. A method as claimed in claim 2, wherein the decay function has a programmable lower threshold value that is applied when the output signal falls below said lower threshold value.

7. A method as claimed in claim 1, for a phase locked loop susceptible to a reference frequency change including a controlled oscillator normally controlled by a first control signal from a loop filter, further comprising:

determining from a current frequency of the controlled oscillator, a new reference frequency and a frequency slope limit requirement, a time period T to change the oscillator frequency to the new current frequency while meeting said frequency slope requirement; and if a predetermined condition is met comprising the difference in frequency between said new reference frequency and the current oscillator frequency being greater than a predetermined value, replacing said first control signal by a second control signal to increase the current frequency of the oscillator to the new current frequency over said time period T.

8. A method as claimed in claim 7, wherein said reference frequency change results from a change in reference input, and further comprising:

estimating an average frequency from the new reference frequency and the current oscillator frequency;

determining the ratio of the difference between said average frequency and the current oscillator frequency to obtain said time period T.

9. A method as claimed in claim 8, further comprising obtaining a pulse width information by comparing current and previous reference edge positions and passing the resulting pulse width information through a filter to obtain the average frequency of the new reference.

10. A method as claimed in claim 8, further comprising adjusting the phase of the first signal so as to compensate for a phase change resulting from control of said controlled oscillator by said second control signal to allow hitless switch from phase slope limiting to regular PLL mode.

11. A method as claimed in claim 9, wherein said reference frequency change results from a transient in the reference frequency, and further comprising:

obtaining pulse width information by comparing current and previous reference edge positions;

passing the pulse width information through a low pass filter to estimate the new current reference frequency.

12. A method as claimed in claim 11, wherein said predetermined condition further includes two sequential short term estimates of the difference between the current reference frequency and the new current reference frequency are less than a first threshold, and the difference between the current reference frequency passed through a short-term average filter and the current reference frequency passed through a long-term average filter is less than a second threshold.

13. A method as claimed in claim 12, wherein the first threshold is a multiple of noise variance in the PLL, and the noise variance is estimated by saving the short-term estimates, computing the difference between the saved short-term estimates and the long-term average, averaging the magnitude thereof to obtain the noise variance estimate (noise).

14. A method as claimed in claim 13, wherein the first threshold Thr1 is obtained from the equation $$Thr1 = 3Thr_{noise} + \epsilon$$

where $\epsilon$ is a small constant to take care of cases when $Thr_{noise}$ is zero, and the second threshold Thr2 is obtained from the equation $$Thr2 = \frac{\Delta(T_{long} - 2.5T_{short})}{T_{long}} + 2Thr_{noise}$$

where $\Delta$ is the minimum frequency jump which has to be detected. $T_{long}$ is the time constant of the filter $LPF_{long}$ and $T_{short}$ is the time constant of the filter $LPF_{short}$.

15. A phase locked loop with controlled phase slope wherein a phase error signal controlling a controlled oscillator has a proportional component and an integral component, comprising:

a phase slope controller configured to:

determine whether the proportional component falls within a range bounded by upper and lower limit values;

combine the proportional component with the integral component if the proportional component falls within said range to provide said phase error signal; and otherwise modify the proportional component to meet a phase slope requirement while leaving the integral component unmodified, and combine said modified proportional component with said unmodified integral component to provide said phase error signal.

16. A phase locked loop as claimed in claim 15, wherein the phase slope controller is configured to saturate the proportional component to a value within the range and modulate the output signal with a decay function to obtain a modified proportional component for combination with said integral component to provide said phase error signal if the proportional component falls outside said range.

17. A phase locked loop as claimed in claim 15, wherein said phase slope controller comprises:

a comparator configured to determine whether the proportional component falls within said range;

a switch controlled by said comparator to pass the unmodified proportional component to a loop filter if the proportional component falls within said range and a modified proportional component if the proportional component falls outside said range; and blocks configured to impose said decay function on the proportional component to provided said modified proportional component.

18. A phase locked loop as claimed in claim 15, susceptible to a reference frequency change with controlled frequency slope and including a controlled oscillator normally controlled by a first control signal from a loop filter, said phase locked loop further comprising:

a frequency slope controller configured to:

(i) determine from a current frequency of the controlled oscillator, a new reference frequency and a frequency slope limit requirement, a time period T to change the oscillator frequency to the new current frequency while meeting said frequency slope requirement; and (ii) if a predetermined condition is met comprising the difference in frequency between said new reference frequency and the current oscillator frequency being greater than a predetermined value, replace said first control signal by a second control signal to increase the current frequency of the oscillator to the new current frequency over said time period T.

19. A phase locked loop as claimed in claim 18, wherein said reference frequency change results from a change in reference input, and said frequency slope controller is configured to:

estimate an average frequency from the new reference frequency and the current oscillator frequency; and determine the ratio of the difference between said average frequency and the current oscillator frequency to obtain said time period T.

20. A phase locked loop as claimed in claim 19, wherein the frequency slope controller comprises in succession a pulse width evaluator, a low pass filter, a comparator, an absolute value module, and a divider to obtain said time period T.

21. A phase locked loop as claimed in claim 20, wherein said reference frequency change results from a transient in the reference frequency, and wherein said frequency slope controller is configured to:
   obtain pulse width information by comparing current and previous reference edge positions;
   pass the pulse width information through a low pass filter to estimate the new current reference frequency.

22. A phase locked loop as claimed in claim 18, wherein said frequency slope controller comprises:
   a phase compensator arranged to adjust phase in the PLL loop so as to compensate for phase accumulation during frequency slope limiting operation.

* * * * *